(12) United States Patent
Camerlenghi et al.

(10) Patent No.: US 6,380,582 B2
(45) Date of Patent: *Apr. 30, 2002

(54) AUTOALIGNED ETCHING PROCESS FOR REALIZING WORD LINES IN MEMORY DEVICES INTEGRATED SEMICONDUCTOR SUBSTRATES

(75) Inventors: Emilio Camerlenghi, Bergamo; Elio Colabella, Milan; Luca Pividori, Turin; Adriana Rebora, Agrate Brianza, all of (IT)

(73) Assignee: STMicroelectronics S.r.l., Agrate Brianza (IT)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/528,406

(22) Filed: Mar. 17, 2000

Related U.S. Application Data

(62) Division of application No. 08/997,499, filed on Dec. 23, 1997, now Pat. No. 6,130,165.

(30) Foreign Application Priority Data

Dec. 24, 1996 (IT) ............................................. 96830649

(51) Int. Cl.⁷ ........................ H01L 29/76; H01L 29/788

(52) U.S. Cl. ...................... 257/314; 257/315; 257/316; 257/317; 257/318; 257/319; 257/320; 257/321; 438/201; 438/257; 438/258; 438/259; 438/260; 438/261; 438/262; 438/263; 438/264; 438/265; 438/266

(58) Field of Search ........................... 257/314, 5, 321; 438/201, 257, 5, 266

(56) References Cited

U.S. PATENT DOCUMENTS

| | | | |
|---|---|---|---|
| 5,160,407 A | 11/1992 | Latchford et al. | 156/656 |
| 5,240,870 A | 8/1993 | Bergemont | 437/43 |
| 5,330,938 A | 7/1994 | Camerlenghi | 437/57 |
| 5,342,801 A | 8/1994 | Perry et al. | 437/52 |
| 5,475,250 A | 12/1995 | Bellezza | 257/316 |
| 5,629,230 A | 5/1997 | Fazan et al. | 438/446 |
| 5,847,427 A | * 12/1998 | Hagiwara | 257/324 |
| 5,981,366 A | * 11/1999 | Kiyama et al. | 438/593 |

FOREIGN PATENT DOCUMENTS

EP  573728  * 12/1993

OTHER PUBLICATIONS

S. Wolf and R.N. Tauber, Silicon Processing for the VLSI Era, vol. 1, Lattice Press, p. 553 (1986).

* cited by examiner

Primary Examiner—Tom Thomas
Assistant Examiner—Donghee Kang
(74) Attorney, Agent, or Firm—Lisa K. Jorgenson; Brian L. Johnson; Seed IP Law Group, PLLC

(57) ABSTRACT

Self-aligned etching process for providing a plurality of mutually parallel word lines in a first conducting layer deposited over a plagiarized architecture obtained starting from a semiconductor substrate on which is provided a plurality of active elements extending along separate parallel lines e.g., memory cell bit lines and comprising gate regions made up of a first conducting layer, an intermediate dielectric layer and a second conducting layer with said regions being insulated from each other by insulation regions to form said architecture with said word lines being defined photolithographically by protective strips implemented by means of: a vertical profile etching for complete removal from the unprotected areas of the first conducting layer of the second conducting layer and of the intermediate dielectric layer respectively, and a following isotropic etching of the first conducting layer.

7 Claims, 4 Drawing Sheets

AUTOALIGNED ETCHING PROCESS FOR REALIZING WORD LINES IN MEMORY DEVICES INTEGRATED SEMICONDUCTOR SUBSTRATES

CROSS-REFERENCE TO RELATED APPLICATION

This application is a divisional of pending U.S. patent application Ser. No. 08/997,499, filed Dec. 23, 1997, now U.S. Pat. No. 6,130,165.

TECHNICAL FIELD

The present invention relates to a self-aligned etching process for providing word lines in an electronic memory device integrated on a semiconductor substrate displaying a topography of the matrix type comprising word lines and bit lines.

Specifically the present invention relates to a self-aligned etching process for providing a plurality of parallel word lines in a first conducting layer deposited over a plagiarized architecture obtained starting from a semiconductor substrate on which is provided a plurality of active elements extending along separate parallel lines, e.g., bit lines, for memory cells comprising gate regions formed by a first conducting layer, an intermediate dielectric layer and a second conducting layer, said gate regions being insulated from each other by insulation regions to form this architecture with said word lines being defined photolithographically by protective strips.

The present invention also relates to a memory device with matrix configuration of the cross-point type and comprising bit lines and word lines.

The present invention concerns specifically but hot exclusively a self-aligned etching process for providing word lines in contactless semiconductor memories having a virtual ground circuitry. The following description is given with reference to this specific field of application with the only purpose of simplifying its explanation.

BACKGROUND OF THE INVENTION

As is well known, EPROM or FLASH-EPROM electronic memory devices require the provision on a semiconductor substrate of a matrix-type topography in which a plurality of bit lines having a floating gate region is intersected on the top by a plurality of conducting strips properly called word lines.

A typical topography of this type is shown in the photograph of FIG. 1 obtained by electronic microscopy techniques.

The conventional provision of this matrix-type topography is not entirely without problems and shortcomings because it was verified experimentally that it is possible that the floating gate regions may find themselves contacted by spurious residues of conducting materials not entirely removed during manufacturing.

In the following description given by way of example there are again proposed process steps used to define on a semiconductor substrate a matrix-type topography of an EPROM memory device comprising word lines, bit lines and floating gate regions to better clarify those aspects which are necessary for explaining the technical problems.

Starting from a semiconductor substrate 1, e.g., like the one shown in FIG. 2, in which a division into active areas with the possible presence of a field oxide dividing layer 2 is already provided e.g., like the one shown in FIG. 2A and multiple deposits are made over the entire surface of the substrate.

Firstly a thin gate oxide layer 3 is deposited. Then a deposition of a first polysilicon layer 4, identified by the name POLY1, is provided. A deposition of a second dielectric interpoly layer 5 follows, e.g., ONO, such an interpoly layer is encapsulated on the top by another layer 6 of polysilicon which is identified by the name POLYCAP.

At this point a masked photolithography step which for convenience is identified by the name "POLY1 mask" defines a topography of protected areas for the gate regions and related bit lines.

A self-aligned etching allows removal of parallel strips of multiple layers until reaching the active areas of the substrate 1.

This etching phase removes from the unprotected areas of the photolithography the POLYCAP layer 6, the ONO layer 5, the POLY1 layer 4, the gate oxide layer 3 and the field oxide 2 if necessary where present.

This defines a spatial geometry on the semiconductor substrate 1 in which it is possible to recognize a plurality of active elements extending along separate parallel lines, e.g., memory cell bit lines 13, and corresponding gate regions.

The gate regions 13 are formed as shown in FIG. 2 by a stratified structure of POLYCAP—ONO—POLY1—gate oxide and field oxide if any.

During performance of this self-aligned etching, removal of the POLYCAP layer 6 causes the deposition of polymers which create a pair of steps 10 or ribs on the underlying POLY1 layer 4, which thus projects laterally with respect to the layers deposited above as shown in FIGS. 2 and 4.

Another cause which could be at the origin of the formation of this pair of steps 10 is generally an additional oxidation step usually used for sealing the bit lines 13. During this oxidation step the POLYCAP layer 6 can reoxidize more than the POLY1 layer 4 (depending on the type of dopant in POLY1) as shown in FIG. 2.

The above mentioned step 10 formed by the POLY1 layer 4 projecting laterally can originate a short circuit between adjacent floating gate regions once a self-aligned etching has been completed to define word lines and hence individual memory cells.

FIG. 3 shows an electronic microscope photograph of a semiconductor substrate having a matrix-type topography after performance of a self-aligned etching to define the word lines, which can be identified in the high-luminosity areas which are connected by thin white strips revealing the presence of the steps 10.

The successive process steps for the provision of an EPROM memory device call for the use of a planarization method in which a first insulating dielectric film 8 and a second planarizing dielectric film 7 are deposited in the interstitial regions delimited by the gate regions 13 to obtain plagiarized architecture 9 as shown in FIG. 2.

It is important to note that the above described process causes the first insulating dielectric film 8 to act as a protective micromask for the step 10 created previously.

Provision of the plurality of word lines intersecting the gate regions 13 calls for the deposition of a conducting layer entirely covering the plagiarized architecture 9 as shown in FIG. 4.

This conducting layer can be obtained by means of successive deposition of a protective layer 12, e.g., of polysilicon and indicated for convenience by the name POLY2, and a final layer 11 of silicide, e.g., tungsten silicide.

To define the spatial geometry of the word lines there is again made use of a conventional photolithography step with an appropriate mask usually indicated as a POLY2 mask designating unprotected areas in which a self-aligned etching can be performed even for the word lines.

Another objective of this etching is to mutually insulate the individual memory cells by removing materials from the floating gate regions unprotected by the photolithography step.

Those skilled in the art usually perform this self-aligned etching in two successive steps and with a vertical profile.

The first step calls for removal of the conducting layer 11, 12 and the underlying POLYCAP layer 6 while the second step calls for removal of the ONO layer 5 and POLY1 layer 4.

The prior art process described up to now has provided on the semiconductor substrate 1 a matrix topography comprising gate regions, corresponding bit lines 13 and word lines orthogonal thereto. This topography is widely used in EPROM or $E^2$PROM memory devices and in particular in EPROM, Flash EPROM and EEPROM memory devices having a cross-point and virtual ground structure as described, e.g., in European Patent No. 0 573 728.

Although meeting the purpose, there are some critical aspects of the above described process which require a remedy.

In particular, the existence of the pair of steps 10 present in the floating gate regions associated with each bit line 13 between the POLYCAP layer 6 and the underlying layers is undesirable. As mentioned, these steps can originate undesired contacts which can affect the reliability of the memory devices.

In addition, the usual self-aligned etchings having a vertical profile for definition of the word lines as well as for insulation of the individual memory cells are quite inadequate for removing said steps 10 as may be seen in FIG. 3.

Indeed, it happens that after removal of the ONO layer 5 and POLY1 layer 4 the pairs of steps 10 still remain present because protected by the micromask created by the first dielectric insulation film 8 used for planarization of the architecture 9.

In this manner the floating gate regions of adjacent memory cells made by means of self-aligned etching of the word lines come into mutual electrical contact.

SUMMARY OF THE INVENTION

An object of the present invention is to create a self-aligned etching process for a definition of geometry associated with word lines which would allow overcoming the above-mentioned shortcomings which still limit the reliability of the memory devices provided in accordance with the prior art.

An embodiment of the present invention uses a definition of word lines and individual memory cells, a self-aligned etching with a vertical profile limited to removal of a conducting layer and an underlying polysilicon layer.

Subsequent removal of the second polysilicon layer is necessary for insulation of the individual memory cells and is provided by means of an isotropic etching.

Characteristics and advantages of the process in accordance with the present invention are set forth in the description of an embodiment thereof given below by way of non-limiting example with reference to the annexed drawings.

DETAILED DESCRIPTION OF THE INVENTION

Figure 1:
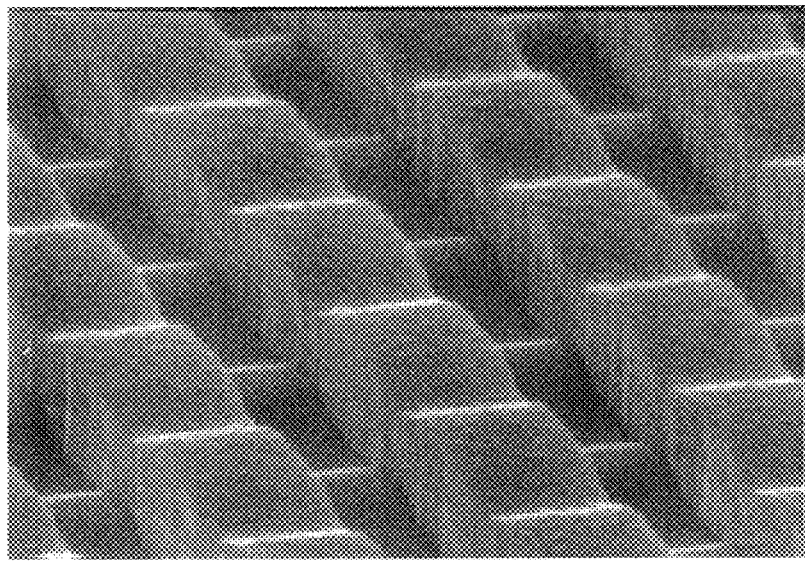
FIG. 1 shows an electronic microscope photograph of a plurality of Flash EPROM memory cells having a matrix-type topography of which can be seen only the bit lines.
Figure 3:
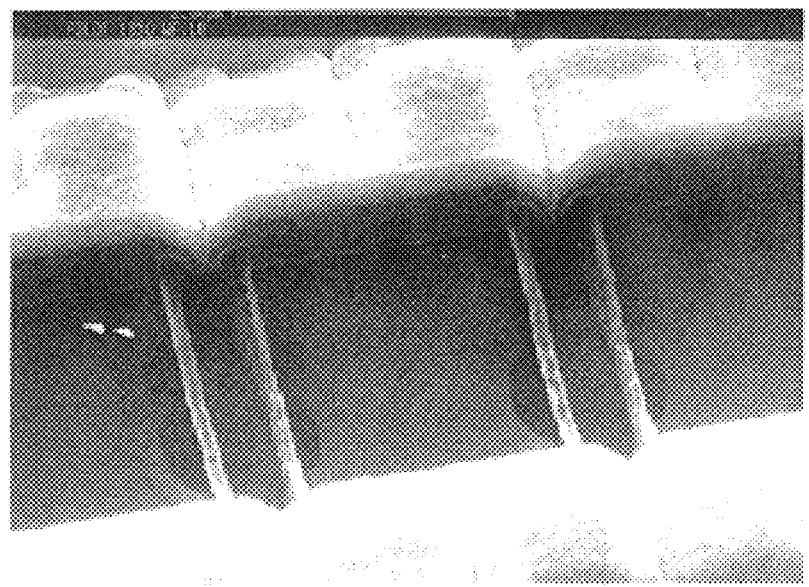
FIG. 3 shows an electronic microscope photograph of a semiconductor substrate having a matrix-type topography and taken after performance of a self-aligned etching for the definition of the word lines.
Figure 2:
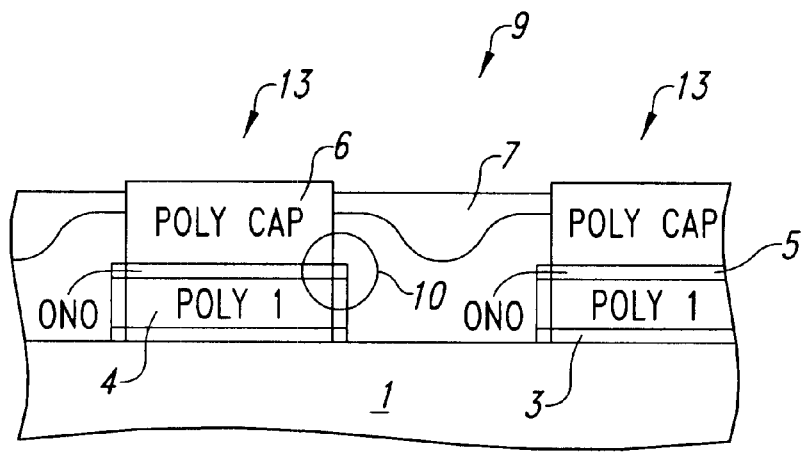
FIGS. 2 and 2A show diagrammatically and in enlarged scale a vertical cross section of a semiconductor electronic device with a plagiarized architecture comprising gate regions conformed as a stratified POLYCAP—ONO—POLY1—gate oxide structure, with the presence of field oxide shown in FIG. 2A.
Figure 2A:
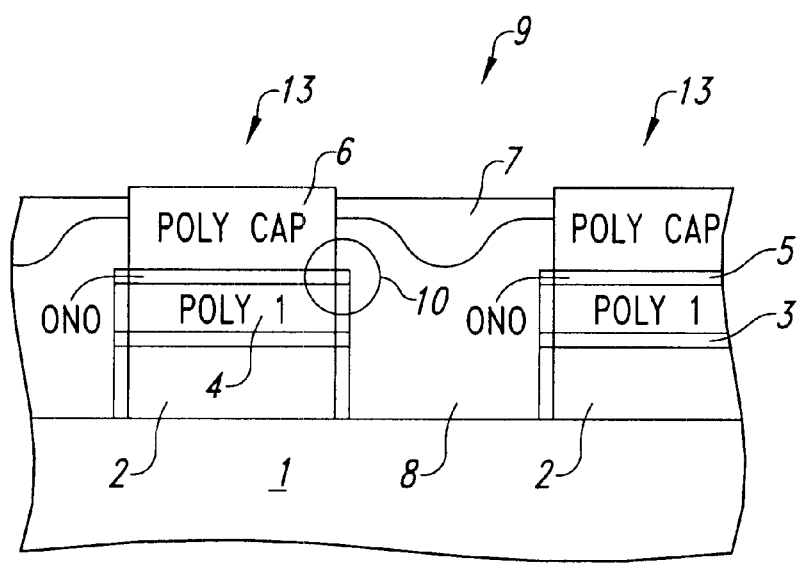
Figure 4:
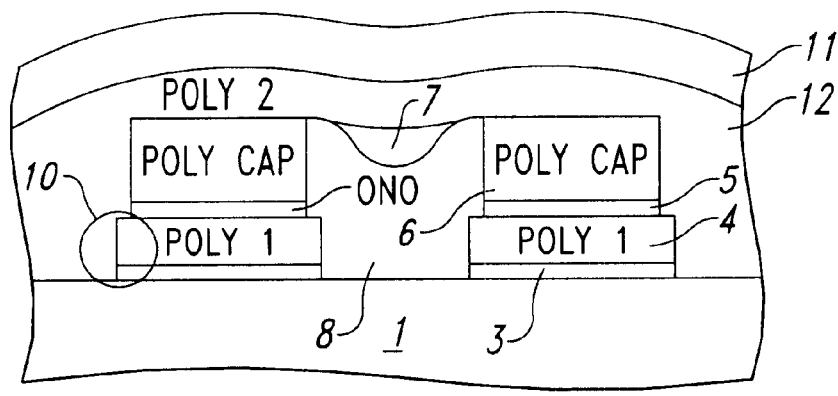
FIGS. 4 and 4A show schematically and in enlarged scale, with the presence of field oxide shown in FIG. 4A, a vertical cross section of a semiconductor electronic device with a plagiarized architecture covered above by a conducting layer provided in accordance with the prior art.
Figure 4A:
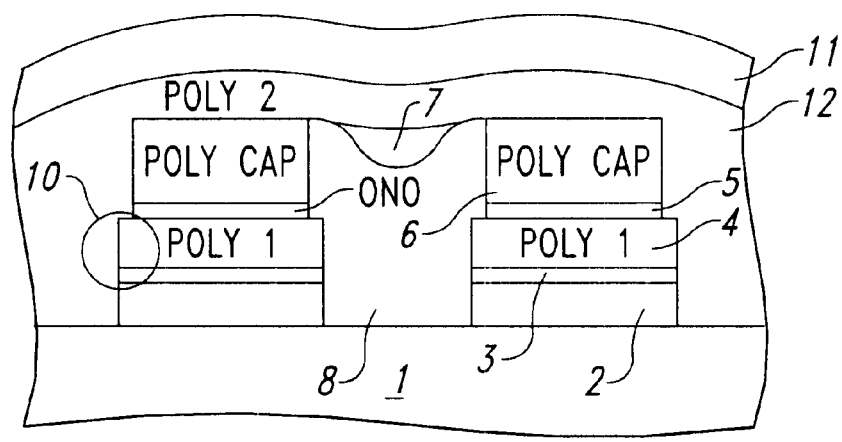

With reference to the Figures there is now described a self-aligned etching process for providing a plurality of mutually parallel word lines in a first conducting layer made up of a pair of superimposed layers 11, 12.

These layers 11, 12 are deposited over a plagiarized architecture 9 obtained starting from a semiconductor substrate 1 on which a plurality of active elements is provided extending along separated parallel lines, e.g., bit lines 13, of memory cells.

These memory cells comprise gate regions made up of a thin gate oxide layer 3, a first conducting layer 4, an intermediate dielectric layer 5 and a second conducting layer 6. The gate regions 13 are mutually insulated by insulating dielectric films 7, 8 deposited between the gate regions 13 to form said plagiarized architecture 9.

The word lines are defined photolithographically by protective strips which are orthogonal to the bit lines.

Figure 5:
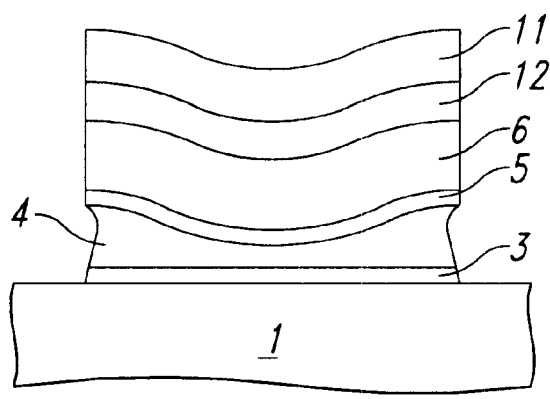
FIGS. 5 and 5A show schematically and in enlarged scale, with the presence of field oxide shown in FIG. 5A, a vertical cross section of a semiconductor electronic device limited to a gate region conformed as a stratified POLY2—POLYCAP—ONO—POLY1 structure created by a process in accordance with the present invention after etching performed with a so-called POLY2 mask.
Figure 5A:
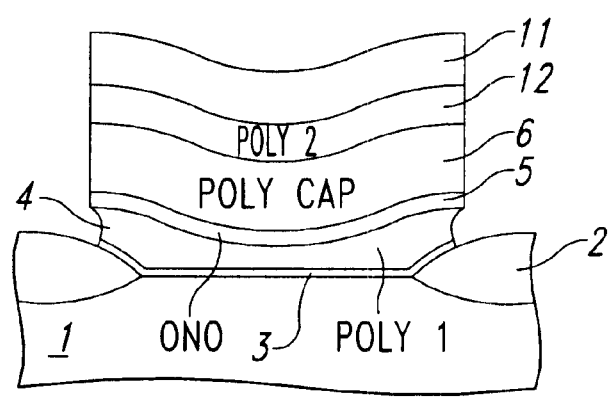

In the example of FIG. 5 is illustrated the vertical cross section of a floating gate region following provision of a self-aligned etching in accordance with the principles of the present invention.

The vertical cross section of the floating gate region shows a stratified structure built over a semiconductor substrate 1 and comprises an optional field oxide layer 2, a thin gate oxide layer 3, a first polysilicon conducting layer 4 indicated as POLY1, an interpoly dielectric layer 5, e.g, ONO, and a second conducting polysilicon layer 6 indicated as POLYCAP. Over the POLYCAP layer 6 is provided another conducting layer including two layers 12, 11, i.e., the first 12 of polysilicon termed also POLY2 and the second 11 of silicide e.g., tungsten silicide ($WSi_2$).

Advantageously in accordance with the present invention the etching for definition of the word line geometry and insulation of the individual memory cells is provided in two successive steps.

In a first step there is provided the action of a self-aligned etching starting from the exposed surface of the additional conducting layer 11, 12. This etching proceeds with a vertical profile (an isotropic etch) for removal of the conducting layer 11, 12 and of the underlying layers 6 and 5 of POLYCAP and ONO from the gate regions 13 not protected by the photolithographic process. As mentioned above, a POLY2 mask is used for definition of the word lines in the photolithography step.

In the second step of the process in accordance with the present invention the use of an isotropic etching is called for removal of the POLY1 layer 4 from the floating gate regions 13.

This isotropic etching can extend its action even laterally so as to remove also the pair of polysilicon steps 10 formed as fully explained with reference to the prior art. The isotropic etching removes the POLY1 layer 4, including the steps 10, without removing the layers 5, 6, 11, 12, because the layers 5, 6, 11, 12 are protected by a polymeric passivating layer formed during the anisotropic portion of the self-aligning etching.

The repeatability and effectiveness of the process proposed is well correlated with the choice of an isotropic etching time sufficient to remove the pair of steps.

The effect secured by employing this type of etching in this process step is clearly visible in FIG. 5 in which the vertical cross section of the individual cell taken from the floating gate region 13 shows a characteristic morphology easily identifiable by means of a SEM, TEM or FIB analysis.

Indeed, there can be seen a typical undercut of the POLY1 layer 4 linked to the use of the isotropic etching in the second process step.

One of ordinary skill in the art will surely recognize in the process proposed here a solution to all those technical problems in which there is conducting material previously not removed because protected by undesired micromasks which can cause spurious contacts.

It is noted in particular that the technical problem set forth above and concerning the possibility of spurious contacts between the floating gate regions associated with adjacent memory cells remains even when the profile of the vertical cross section of the gate regions 13 is the trapezoid type and not only in the presence of steps as described.

In conclusion, the self-aligned etching proposed by the present invention is capable of ensuring good reliability of the memory devices with matrix configuration if provided in accordance with the process described here.

It should be understood that even though numerous advantages of the present invention have been set forth in the foregoing description, the disclosure is illustrative only. Changes may be made in detail and yet remain within the broad principles of the present invention.

What is claimed is:

1. An electronic memory device integrated on a semiconductor substrate and having a plurality of matrix-type topography self-aligned gate regions formed by a plurality of parallel word lines substantially orthogonal to a plurality of parallel bit lines, wherein each of the self-aligned gate regions comprises:

a first conducting layer on the semiconductor substrate;

an intermediate dielectric layer placed on top of the first conducting layer;

a second conducting layer placed on top of the dielectric layer; and a third conducting layer for the definition of the word lines wherein the third and the second conducting layer and the dielectric layer are etched away between word lines to align vertically to the semiconductor substrate to form a vertically aligned line without any substantial undercuts with respect to the vertically aligned line and the first conducting layer is isotropically etched thereby no part of the first conducting layer of the gate regions in a word line is extending outside of the vertically aligned line formed by the dielectric, the second conducting and the third conducting layer and a portion of the first conducting layer further including a substantial undercut with respect to the vertically aligned line.

2. The electronic memory device of claim 1 wherein the first and the second conducting layer are polysilicon.

3. The electronic memory device of claim 1 wherein the dielectric layer is an interpoly ONO.

4. The electronic memory device of claim 1 wherein the third conducting layer is provided by means of successive depositions of a first and a second layer having different chemical composition.

5. The electronic memory device of claim 4 wherein the first layer is a polysilicon.

6. The electronic memory device of claim 4 wherein the second layer is a silicide.

7. The electronic memory device of claim 6 wherein the second layer is a tungsten silicide.

\* \* \* \* \*